United States Patent
Weichel et al.

(10) Patent No.: US 11,619,685 B2
(45) Date of Patent: Apr. 4, 2023

(54) DEVICE THAT INCLUDES A SENSOR UNIT AND A SELF-CALIBRATION FUNCTION

(71) Applicant: Robert Bosch GmbH, Stuttgart (DE)

(72) Inventors: Christian Weichel, Schönkirchen (DE); Fernando Suarez Lainez, Reutlingen (DE); Julian Bartholomeyczik, Reutlingen (DE); Martin Werner, Tuebingen (DE); Sebastian Fischer, Reutlingen (DE)

(73) Assignee: ROBERT BOSCH (FRANCE) S.A.S., Saint-Ouen (FR)

( * ) Notice: Subject to any disclaimer, the term of this patent is extended or adjusted under 35 U.S.C. 154(b) by 0 days.

(21) Appl. No.: 17/262,030

(22) PCT Filed: Jun. 14, 2019

(86) PCT No.: PCT/EP2019/065772
§ 371 (c)(1),
(2) Date: Jan. 21, 2021

(87) PCT Pub. No.: WO2020/035191
PCT Pub. Date: Feb. 20, 2020

(65) Prior Publication Data
US 2022/0043075 A1 Feb. 10, 2022

(30) Foreign Application Priority Data
Aug. 17, 2018 (DE) .......... 102018213940.7

(51) Int. Cl.
*G01R 33/00* (2006.01)
*G08G 1/042* (2006.01)

(52) U.S. Cl.
CPC ......... *G01R 33/0035* (2013.01); *G08G 1/042* (2013.01)

(58) Field of Classification Search
CPC ..................... G01R 33/0035; G08G 1/042
See application file for complete search history.

(56) References Cited

U.S. PATENT DOCUMENTS

| | | | |
|---|---|---|---|
| 9,255,799 B2* | 2/2016 | Landers | G01D 18/008 |
| 2012/0296560 A1* | 11/2012 | Zheng | G08G 1/0129 |
| | | | 701/119 |
| 2013/0099943 A1* | 4/2013 | Subramanya | G08G 1/14 |
| | | | 340/933 |

(Continued)

FOREIGN PATENT DOCUMENTS

| | | |
|---|---|---|
| DE | 19821439 A1 | 11/1999 |
| DE | 19962997 A1 | 6/2001 |

(Continued)

OTHER PUBLICATIONS

International Search Report for PCT/EP2019/065772, dated Aug. 22, 2019.

*Primary Examiner* — Alvaro E Fortich
(74) *Attorney, Agent, or Firm* — Norton Rose Fulbright US LLP; Gerard Messina

(57) ABSTRACT

A device that includes a sensor unit and a processing unit. The sensor unit is configured to detect at least one measured value at a predetermined point in time. The processing unit is configured to carry out a self-calibration of the device as a function of the detected measured value. A method for self-calibration of a device is also described.

6 Claims, 1 Drawing Sheet

(56) References Cited

U.S. PATENT DOCUMENTS

2013/0338955 A1* 12/2013 Landers .................. G01C 17/38
                                                                702/92
2018/0268688 A1*  9/2018 Larcher .................. G08G 1/042
2019/0294889 A1*  9/2019 Sriram ................... G06V 10/82

FOREIGN PATENT DOCUMENTS

DE        102013222316 A1    5/2015
DE        102015202784    *  8/2016  ............ B60W 30/06
DE        102015202784 A1    8/2016
DE        102017213806 A1    2/2019

* cited by examiner

DEVICE THAT INCLUDES A SENSOR UNIT AND A SELF-CALIBRATION FUNCTION

BACKGROUND INFORMATION

The present invention is directed to a device that includes a sensor unit and a processing unit, the sensor unit being configured to detect at least one measured value at a predetermined point in time.

The device may be designed in such a way that, for example, it is used for determining an occupancy state of a parking space of a parking area. For this purpose, the sensor unit includes a magnetic field sensor, for example, the processing unit being configured to determine the occupancy state of the parking space with the aid of magnetic field measured values that are detected by the magnetic field sensor.

A typical problem in such a device is that the measuring conditions may change over time, for example due to a vehicle parking in a neighboring parking space, or because the sensor unit has a drift. As a result, the determination of the occupancy state of the parking space may be falsified or erroneous.

Moreover, the present invention relates to a method for self-calibration of a device according to the present invention.

SUMMARY

The present invention is directed to a device that includes a sensor unit and a processing unit, the sensor unit being configured to detect at least one measured value at a predetermined point in time.

One aspect of the present invention is that the processing unit is configured to carry out a self-calibration of the device as a function of the detected measured value.

Self-calibration is understood to mean that the device automatically adapts to different measuring conditions to allow a correct conclusion to continue to be drawn, based on a measurement with the aid of the sensor unit. For this purpose, the environmental parameters are correspondingly detected as a measured value, and on this basis a calibration of the device takes place.

A predetermined point in time is understood to mean that the sensor unit detects the measured value, for example, with a predefined frequency, for example once per hour. However, it is also possible for the detection to take place randomly.

Furthermore, it is also possible for the measured value detection to take place when the sensor unit obtains an interrupt command that, for example, may be triggered by an occurring change in a measured value or received due to a signal from outside the device.

It is also possible for the sensor unit to be configured to detect a plurality of measured values at various points in time or to detect measured values over a predetermined time period with an appropriate frequency, it being possible for the processing unit to be configured to carry out the self-calibration of the device as a function of a plurality of these measured values.

It is advantageous that due to the self-calibration of the device, no interaction between the user and the device is necessary during use of the device, thus correspondingly simplifying the use of the device. In addition, installation of the device at an arbitrary location may take place more rapidly; i.e., the device may deliver plausible results more quickly. Furthermore, such measuring results of the device may have an increased quality, which in turn means that the long-term stability of the device may be improved. This is due to the fact that the device may appropriately respond to changing environmental parameters or also to a drift of the sensor so that reliable functioning of the device may be ensured, which in turn means that the determination of the occupancy state of the parking space has a higher likelihood of being correct than for the case in which no self-calibration of the device was carried out.

In one embodiment of the device according to the present invention, it is provided that the processing unit is configured to ascertain a calibration value as a function of the detected measured value with the aid of a mathematical model, and to carry out the self-calibration as a function of the ascertained calibration value.

It is advantageous that this provides a particularly effective option for carrying out the self-calibration process.

A calibration value is understood to mean, for example, a value in which the likelihood that the detected measured value has been influenced by changing environmental parameters or by a drift of the sensor unit has been taken into account, such a finding then being used as the basis for the self-calibration. For this purpose, the detected measured value is typically compared to previously detected measured values in order to draw conclusions concerning its plausibility.

In accordance with an example embodiment of the present invention, i a device for determining the occupancy state of a parking space, for example a calibration magnetic field is determined which reflects the corresponding external influences or also the drift of the sensor unit. In determining the occupancy state, the calibration magnetic field is then subtracted from a detected magnetic field, and the result is then appropriately evaluated to allow a conclusion to be drawn as to whether the parking space is occupied or unoccupied. The calibration value thus represents a type of offset that is incorporated into an instantaneous determination of the occupancy state, in order to allow the determination of the occupancy state by the device to be made as if it were still in the starting state, without any changes acting on it that could adversely affect a determination.

According to one embodiment of the device according to the present invention, it is provided that the mathematical model is designed as an adaptive filtering or an unsupervised binary classification or a nearest neighbor classification or a k-means algorithm.

It is advantageous that by use of such a mathematical model, a particularly rapid self-calibration process is possible which may also be designed with few resources.

According to one embodiment of the device according to the present invention, it is provided that the processing unit is configured to filter the detected measured value, in particular as a function of a measured value that is detected at an earlier point in time.

A filtered measured value is obtained in this way. The processing unit is then appropriately configured to carry out a self-calibration of the device as a function of the filtered measured value.

It is advantageous that the self-calibration of the device may be carried out even more precisely by use of a filtered measured value.

Moreover, the present invention relates to a method for self-calibration of a device according to the present invention. IN accordance with an example embodiment of the present invention, the method includes at least the following method steps:

a. detecting at least one measured value at a predetermined point in time with the aid of the sensor unit,
b. carrying out a self-calibration of the device as a function of the at least one detected measured value.

It is advantageous that due to the self-calibration of the device, no interaction between the user and the device is necessary during use of the device, thus correspondingly simplifying the use of the device. In addition, an installation of the device at an arbitrary location may take place more rapidly; i.e., the device may deliver plausible results more quickly. Furthermore, such measuring results of the device may have an increased quality, which in turn means that the long-term stability of the device may be improved. This is due to the fact that the device may appropriately respond to changing environmental parameters or also to a drift of the sensor so that reliable functioning of the device may be ensured, which in turn means that the determination of the occupancy state of the parking space has a higher likelihood of being correct than for the case in which no self-calibration of the device was carried out.

In one embodiment of the method according to the present invention, it is provided that a calibration value is ascertained in method step b as a function of the detected measured value with the aid of a mathematical model, and the self-calibration takes place as a function of the ascertained calibration value. It is advantageous that this provides a particularly effective option for carrying out the self-calibration process.

In one embodiment of the method according to the present invention, it is provided that the mathematical model utilizes an adaptive filtering or an unsupervised binary classification or a nearest neighbor classification or a k-means algorithm.

It is advantageous that by use of such a mathematical model, a particularly rapid self-calibration process is possible which may also be designed with few resources.

In one embodiment of the method according to the present invention, it is provided that between method step a and method step b, a method step c runs in which the detected measured value is filtered, in particular as a function of a measured value that is detected at an earlier point in time.

It is advantageous that the self-calibration of the device may be carried out even more precisely by use of a filtered measured value.

Moreover, the present invention may relate to a parking area that includes at least one parking space, the parking space including a device according to the present invention.

DETAILED DESCRIPTION OF EXAMPLE EMBODIMENTS

Figure 1:
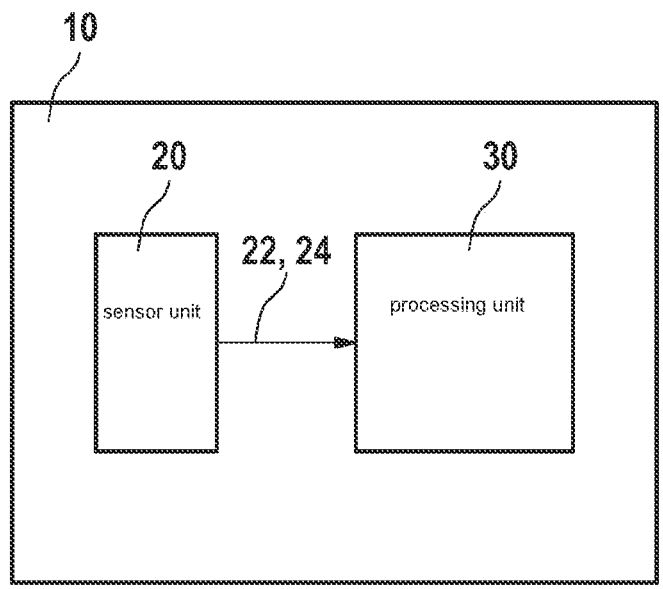
FIG. 1 shows one exemplary embodiment of a device according to the present invention.

FIG. 1 shows one exemplary embodiment of a device according to the present invention. A device 10 is illustrated. Device 10 includes a sensor unit 20 and a processing unit 30. Sensor unit 20 is connected to processing unit 30 in such a way that measured values detected by sensor unit 20 may be tapped by processing unit 30. For this purpose, the connection may have a hard-wired or a wireless design.

Device 10 may be designed in such a way that, for example, it is used for determining an occupancy state of a parking space of a parking area. For this purpose, sensor unit 20 includes a magnetic field sensor, for example, processing unit 30 being configured to determine the occupancy state of the parking space with the aid of magnetic field measured values that are detected by the magnetic field sensor.

Figure 2:
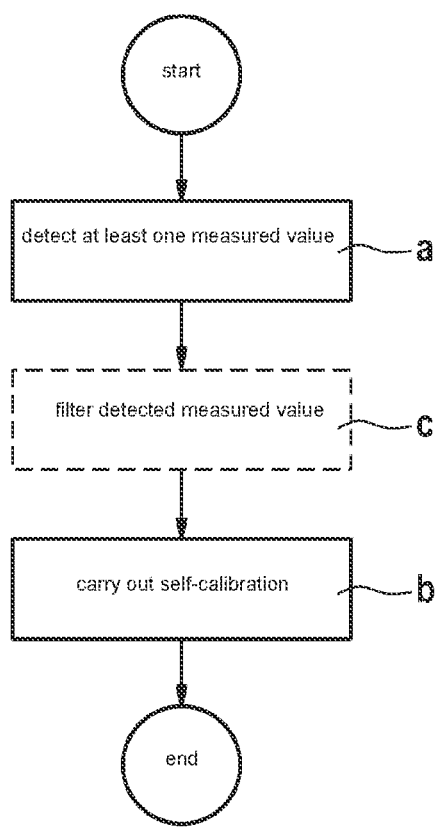
FIG. 2 shows one exemplary embodiment of a method according to the present invention for self-calibration of a device according to the present invention.

FIG. 2 shows one exemplary embodiment of a method according to the present invention for self-calibration of a device according to the present invention.

At least one measured value 22 is initially detected at a predetermined point in time in a method step a with the aid of sensor unit 20 of device 10. A self-calibration of device 10 is subsequently carried out in a method step b as a function of the at least one detected measured value 22.

A calibration value may be ascertained in method step b as a function of detected measured value 22 with the aid of a mathematical model, and the self-calibration may subsequently take place as a function of the ascertained calibration value. An adaptive filtering or an unsupervised binary classification or a nearest neighbor classification or a k-means algorithm, for example, may be utilized as a mathematical model.

In addition, between method step a and method step b, a method step c optionally runs in which detected measured value 22 is filtered. The filtering takes place in particular as a function of a measured value 24 that is detected at an earlier point in time. The self-calibration is subsequently carried out in method step b as a function of the filtered measured value.

Device 10 may be used for determining an occupancy state of a parking space of a parking area, for example as described according to FIG. 1.

Thus, for example, an occupancy state of the parking space may be determined after method step b in a method step that is not illustrated.

What is claimed is:

1. A device, comprising:
a sensor configured to detect at least one measured value at a predetermined point in time; and
a processor configured to carry out a self-calibration of the device as a function of the detected at least one measured value,
wherein the processor is configured to ascertain a calibration value as a function of the detected at least one measured value using a mathematical model, and to carry out the self-calibration as a function of the ascertained calibration value,
wherein the sensor includes a magnetic field sensor which is configured to determine an occupancy state of a parking space via the at least one measured value of a magnetic field that is detected by the magnetic field sensor,
wherein a calibration magnetic field is determined, and the calibration magnetic field is subtracted from the detected magnetic field to determine the occupancy state of the parking space.

2. The device as recited in claim 1, wherein the mathematical model is an adaptive filtering or an unsupervised binary classification or a nearest neighbor classification or a k-means algorithm.

3. The device as recited in claim 1, wherein the processor is configured to filter the detected at least one measured value as a function of a measured value detected at an earlier point in time.

4. A method for self-calibration of a device, the device including a sensor unit and a processing unit, the method comprising the following method steps:

a. detecting at least one measured value at a predetermined point in time with using the sensor unit;
b. carrying out a self-calibration of the device as a function of the at least one detected at least one measured value,
wherein, in step b, a calibration value is ascertained as a function of the detected at least one measured value using a mathematical model, and wherein the self-calibration takes place as a function of the ascertained calibration value,
wherein the sensor includes a magnetic field sensor which is configured to determine an occupancy state of a parking space via the at least one measured value of a magnetic field that is detected by the magnetic field sensor,
wherein a calibration magnetic field is determined, and the calibration magnetic field is subtracted from the detected magnetic field to determine the occupancy state of the parking space.

5. The method as recited in claim 4, wherein the mathematical model utilizes an adaptive filtering or an unsupervised binary classification or a nearest neighbor classification or a k-means algorithm.

6. The method as recited in claim 4, wherein between step a and step b, a method step c is performed in which the detected at least one measured value is filtered as a function of a measured value detected at an earlier point in time.

\* \* \* \* \*